United States Patent
Tu et al.

(10) Patent No.: US 12,237,452 B2
(45) Date of Patent: Feb. 25, 2025

(54) LIGHT EMITTING DIODE (LED) PACKAGE AND METHOD FOR MANUFACTURING THE SAME

(71) Applicant: Quanzhou Sanan Semiconductor Technology Co., Ltd., Quanzhou (CN)

(72) Inventors: Jianbin Tu, Xiamen (CN); Junpeng Shi, Xiamen (CN); Weng-Tack Wong, Xiamen (CN); Yanqiu Liao, Xiamen (CN); Chen-ke Hsu, Xiamen (CN)

(73) Assignee: QUANZHOU SANAN SEMICONDUCTOR TECHNOLOGY CO., LTD., Quanzhou (CN)

( * ) Notice: Subject to any disclaimer, the term of this patent is extended or adjusted under 35 U.S.C. 154(b) by 580 days.

(21) Appl. No.: 17/375,246

(22) Filed: Jul. 14, 2021

(65) Prior Publication Data
US 2021/0343916 A1    Nov. 4, 2021

Related U.S. Application Data

(63) Continuation-in-part of application No. PCT/CN2019/111374, filed on Oct. 16, 2019.

(51) Int. Cl.
*H01L 33/62* (2010.01)
*H01L 33/52* (2010.01)

(52) U.S. Cl.
CPC .............. *H01L 33/62* (2013.01); *H01L 33/52* (2013.01); *H01L 2933/005* (2013.01); *H01L 2933/0066* (2013.01)

(58) Field of Classification Search
CPC ......... H01L 23/49565; H01L 23/49541; H01L 23/49548; H01L 23/49838; H01L 23/3142;
(Continued)

(56) References Cited

U.S. PATENT DOCUMENTS

| | | | |
|---|---|---|---|
| 2011/0222299 A1* | 9/2011 | Takahashi | H01L 33/486 362/363 |
| 2013/0001632 A1* | 1/2013 | Imai | H01L 33/62 257/E33.056 |

(Continued)

FOREIGN PATENT DOCUMENTS

| | | |
|---|---|---|
| CN | 101447541 A | 6/2009 |
| CN | 102916112 A | 2/2013 |

(Continued)

OTHER PUBLICATIONS

Chinese Office Action in CN Appln. No. 2021103238331, dated Nov. 1, 2021, 6 pages with English Translation.
(Continued)

*Primary Examiner* — Alia Sabur
(74) *Attorney, Agent, or Firm* — MUNCY, GEISSLER, OLDS & LOWE, P.C.

(57) ABSTRACT

A light emitting diode (LED) package includes a substrate, a metal stage, at least one LED chip and a packaging material. The substrate has an super surface, and a lower surface opposite to the upper surface. The metal stage is formed on the upper surface of the substrate, and has a lumpy structure. The LED chip is mounted on the metal stage. The packaging material covers the LED chip, the metal stage and the substrate. The packaging material and the lumpy structure of the metal stage are engaged with each other.

17 Claims, 8 Drawing Sheets

(58) Field of Classification Search
CPC ....... H01L 33/62; H01L 33/38; H01L 33/486; H01L 33/48; H01L 33/54; H01L 2924/18301; H01L 2224/30517; H01L 2224/32221; H05K 2201/09781
See application file for complete search history.

(56) References Cited

U.S. PATENT DOCUMENTS

2013/0299968 A1* 11/2013 Lin .................. H01L 23/49827
257/737
2015/0243856 A1* 8/2015 Yamada .................. H01L 33/32
257/99

FOREIGN PATENT DOCUMENTS

| CN | 106558640 | 4/2017 |
| CN | 109830589 A | 5/2019 |

OTHER PUBLICATIONS

Search Report issued to PCT application No. PCT/CN2019/111374 on Jul. 8, 2020 (4 pages).
International Preliminary Report on Patentability in International Appln. No. PCT/CN2019/111374, issued on Apr. 19, 2022, 10 pages (with English translation).

* cited by examiner

LIGHT EMITTING DIODE (LED) PACKAGE AND METHOD FOR MANUFACTURING THE SAME

CROSS-REFERENCE TO RELATED APPLICATION

This application is a bypass continuation-in-part (CIP) application of PCT International Application No. PCT/CN2019/111374, filed on Oct. 16, 2019. The entire content of the International patent application is incorporated herein by reference.

FIELD

The disclosure relates to a light emitting diode (LED) packaging technique, and more particularly to an LED package and a method for manufacturing the LED package.

BACKGROUND

Conventional deep ultraviolet light emitting diodes (DUV-LEDs) are packaged by virtue of a packaging material made from ceramic and quartz glass. Such LED package has a relatively large volume and relatively low light extraction efficiency. Another conventional LED packaging technique utilizes a packaging material made from ceramic substrate and silicone rubber. However, deep ultraviolet light might easily cause cracking of silicone rubber, and silicone rubber has relatively low light extraction efficiency with respect to deep ultraviolet light. Still another conventional LED packaging technique utilizes fluororesin as a packaging material. However, fluororesin is difficult to be machined due to its relatively weak adhesion, and might be separated from a substrate due to external force or vibration during a machining process, or generate air bubbles during reflow soldering.

SUMMARY

Therefore, an object of the disclosure is to provide a light emitting diode (LED) package that can alleviate at least one of the drawbacks of the prior art.

According to the disclosure, the light emitting diode (LED) package includes a substrate, a metal stage, at least one LED chip and a packaging material. The substrate has an upper surface and a lower surface opposite to the upper surface. The metal stage is formed on the upper surface of the substrate, and has a lumpy structure. The LED chip is mounted on the metal stage. The packaging material covers the LED chip, the metal stage and the substrate. The packaging material and the lumpy structure of the metal stage are engaged with each other.

Another an object of the disclosure is to provide a method for manufacturing a light emitting diode (LED) package that can alleviate at least one of the drawbacks of the prior art.

According to the disclosure, the method includes steps of: a) providing a substrate, the substrate having an upper surface and a lower surface that is opposite to the upper surface; b) forming a metal stage on the upper surface of the substrate, the metal stage having a lumpy structure; c) mounting at least one LED chip onto the metal stage; and d) covering the LED chip, the metal stage and the substrate with a packaging material, the packaging material and the lumpy structure of the metal stage being engaged with each other.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
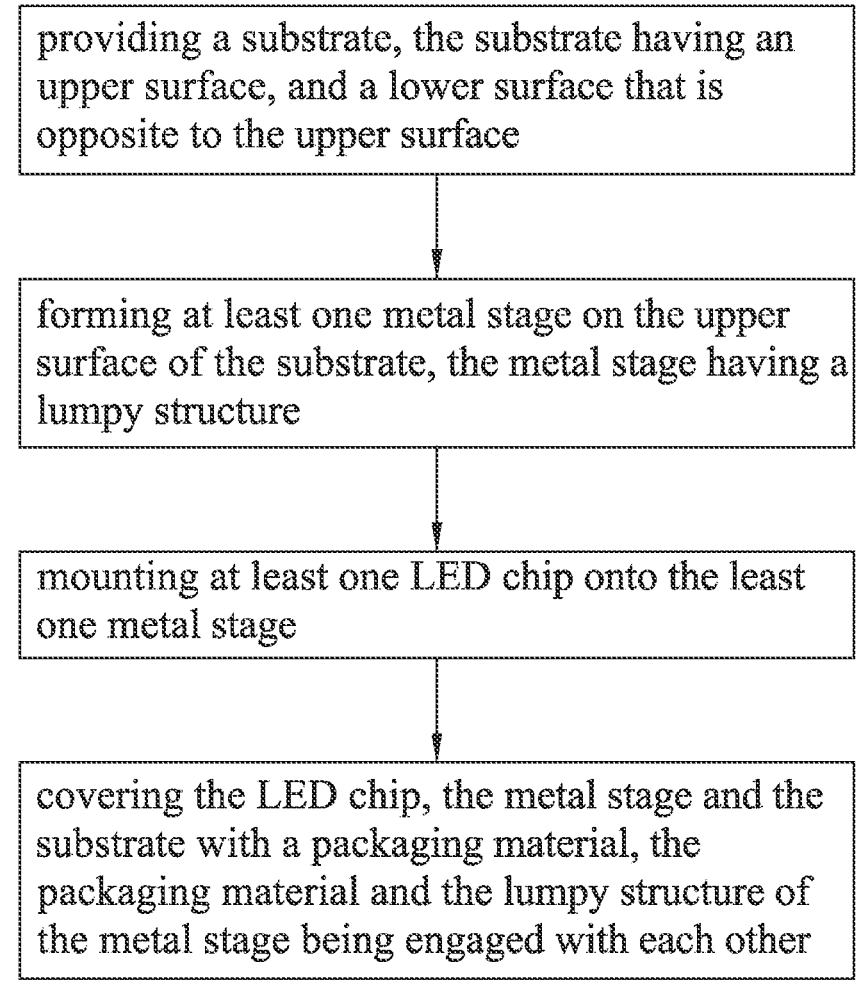
FIG. 1 is a flow chart illustrating steps of a method for manufacturing a LED package.

Before the disclosure is described in greater detail, it should be noted that where considered appropriate, reference numerals or terminal portions of reference numerals have been repeated among the figures to indicate corresponding or analogous elements, which may optionally have similar characteristics.

Since an inorganic fluororesin material has a refractive index of about 1.34, a relatively high light extraction efficiency with respect to deep ultraviolet, and is reliable, fluororesin is adequate for packaging deep ultraviolet light emitting diodes (DUV-LED(s)). However, fluororesin is difficult to be machined because of its relatively weak adhesion, and may be separated from a substrate due to external force or vibration during a machining process, or generate air bubbles during reflow soldering.

First Embodiment

Referring to FIGS. 1 to 4, a first embodiment is directed to a method for manufacturing an LED package, and includes steps of:

1) providing a substrate 10, the substrate 10 having an upper surface, and a lower surface that is opposite to the upper surface;
2) forming at least one metal stage 20 on the upper surface of the substrate 10, the metal stage 20 having a lumpy structure;
3) mounting at least one LED chip 30 onto the at least one metal stage 20; and 4) covering the LED chip 30, the metal stage 20 and the substrate 10 with a packaging material 40.

The substrate 10 may be made of a material that is commonly used in this field, such as ceramic or silicon. Preferably, the substrate 10 is made of ceramic.

Figure 2:
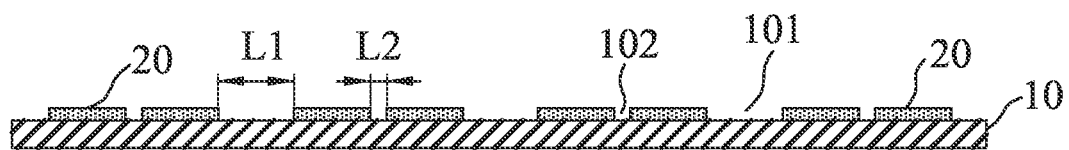
FIG. 2 is a sectional view illustrating a plurality of metal stages formed on a substrate.
Figure 3:
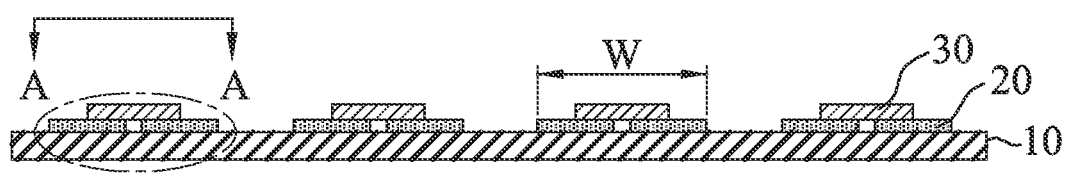
FIG. 3 is a sectional view illustrating a plurality of LED chips respectively mounted on the metal stages.

With reference to FIGS. 2 and 3, in step 2), when a plurality of metal stages 20 are formed on the upper surface of the substrate 10, any two adjacent ones of the metal stages 20 are spaced apart from each other by a first gap 101. In step 3), a plurality of LED chips 30 may be respectively mounted to the metal stages 20. In one embodiment, the LED chip 30 is configured as a deep ultraviolet LED chip.

With reference to FIG. 3, in this embodiment, the LED chip(s) 30 is (are) mounted on the metal stage(s) 20 through a flip-chip technique.

Figure 6:
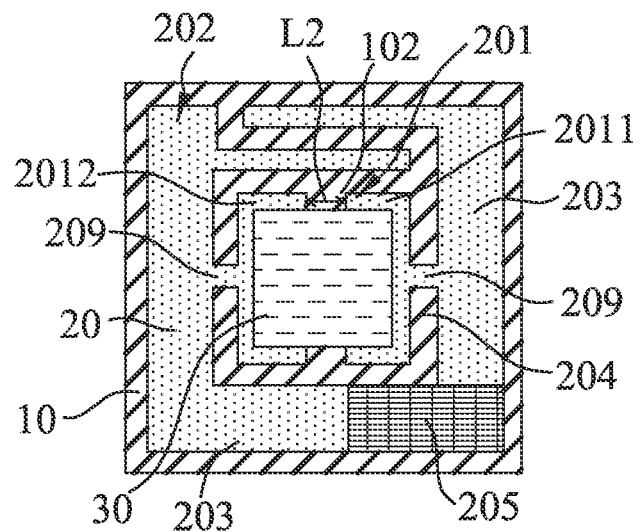
FIG. 6 is a top view of the circled region in FIG. 3, observed in the direction A-A.

With reference to FIG. 6, the metal stage 20 includes a chip-mounting region 201 at a central portion thereof for mounting the LED chip 30 thereon. The chip-mounting region 201 includes a first mounting section 2011 and a second mounting section 2012. The LED chip 30 is mounted on the metal stage 20 through the flip-chip technique, and has positive and negative electrodes. The first mounting section 2011 of the chip-mounting region 201 is connected to one of the positive and negative electrodes of the LED chip 30, and the second mounting section 2012 of the chip-mounting region 201 is connected to the other one of the positive and negative electrodes of the LED chip 30. The first mounting section 2011 and the second mounting section 2012 of the chip-mounting region 201 are spaced apart from each other by a second gap 102. The widths (L1, L2) of the first gap 101 and the second gap 102 may be determined according to the dimensions of the LED chip 30 and the LED package.

The metal stage 20 further includes a boundary region 202 at a periphery thereof, and a recessed region 204 that is formed between the chip-mounting region 201 and the boundary region 202. In one embodiment, the thickness of the boundary region 202 is equal to that of the chip-mounting region 201. In one embodiment, the width of the recessed region 204 is smaller than at least one of the width of the chip-mounting region 201 and the width of the boundary region 202. Preferably, a ratio of the height of the recessed region 204 to the width of the recessed region 204 is no less than 0.5, and the height of the recessed region 204 is equal to the thickness of the boundary region 202. The boundary region 202 includes two spaced-apart boundary sections 203. Each of the boundary sections 203 has a connecting portion 209 connected to a respective one of the first mounting section 2011 and the second mounting section 2012 of the chip-mounting region 201. Since the first mounting section 2011 and the second mounting section 2012 are connected to the positive and negative electrodes of the LED chip 30, the boundary sections 203 of the boundary region 202 may respectively serve as the positive and negative electrodes of the LED chip 30. In one embodiment, each of the boundary sections 203 of the boundary region 202 may have an L-shaped structure. The chip-mounting region 201 and the boundary region 202 cooperatively form the lumpy structure of the metal stage 20.

In one embodiment, the chip-mounting region 201 and the boundary region 202 are completely separated from each other by the recessed region 204. A depth of the recessed region 204 is equal to a thickness of the chip-mounting region 201 and a thickness of the boundary region 202.

In step 2) of this embodiment, the metal stage 20 may be made by forming a thin metal layer on the substrate 10 through an ion-beam sputtering technique, and then increasing the thickness of the thin metal layer through electroplating or chemical plating techniques.

In detail, a mask having a pattern of the chip-mounting region 201 and the boundary region 202 of the metal stage 20 as shown in FIG. 6 (i.e., the pattern of the chip-mounting region 201 and the boundary region 202 observed in a top plan view) is made, and then is adhered to the upper surface of the substrate 10 by a glue or the like.

After the mask is adhered to the substrate 10, a plating process, such as ion-beam sputtering, is performed on the upper surface of the substrate 10 so as to form the thin metal layer with the pattern. In one embodiment, the thin metal layer has a thickness ranging from 10 to 200 micrometers.

Then, another plating process, such as electroplating or chemical plating, is performed on the thin metal layer to increase the thickness of the thin metal layer, so as to form a metal stage 20 with a lumpy structure.

With reference to FIG. 6, in one embodiment, the metal stage 20 further includes a protection component packaging area 205 formed at a portion of the boundary region 202 for mounting a protection device (e.g., a zener diode) mounted. In one embodiment, the protection component packaging area 205 is formed at a corner of the boundary region 202.

Figure 4:
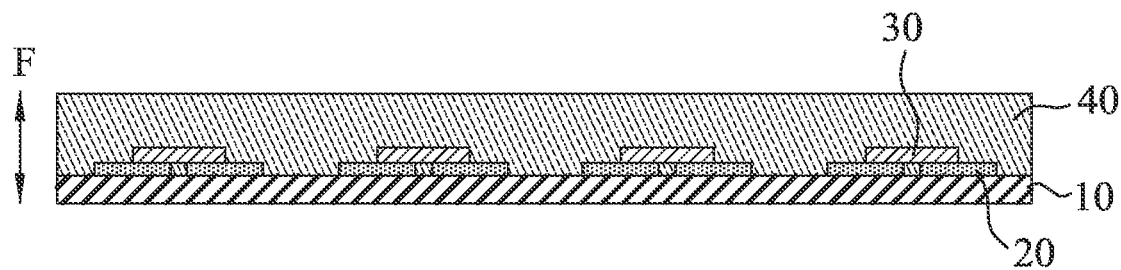
FIG. 4 is a sectional view illustrating a packaging material covering the LED chips, the metal stages and the substrate.

With reference to FIG. 4, in step 4) the packaging material 40 preferably is fluororesin. After the packaging material 40 covers the LED chips 30, the metal stages 20 and the substrate 10, the LED package is heated up, by vacuum heat pressing, baking or hot-pressing, such that the packaging material 40 is filled in the first gaps 101 between the metal stages 20, the second gap 102 in the chip-mounting regions 201 of the metal stages 20, the recessed region 204 of the metal stages 20 and the gaps between the boundary sections 203 of each of the metal stages 20. The packaging material 40 is adhered to the LED chips 30, the metal stages 20 and the substrate 10 after the LED package is heated up, followed by cooling the LED package. Since the packaging material 40 is adhered to the LED chips 30, the metal stages 20 and the substrate 10, and since the packaging material 40 is filled in the first gaps 101 between the metal stages 20, the second gap 102 in the chip-mounting regions 201 of the metal stages 20, the recessed region 204 of the metal stages 20 and the gaps between the boundary sections 203 of each of the metal stages 20, the packaging material 40 and the lumpy structure of the metal stages 20 are engaged with each other, such that binding among the components of the LED package is enhanced, thereby preventing separation of the packaging material 40 from the substrate due to vibration generated during transportation of the LED package.

In addition, ceramic has a coefficient of expansion of $1.8*10^{-5}/°$ C., while fluororesin has a coefficient of expansion of $8\sim12*10^{-5}/°$ C. Although fluororesin deforms relatively seriously during the heating-up and cooling-down processes, the packaging material 40 may not be separated from the substrate 10 since the packaging material 40 and the lumpy structure of the metal stages 20 are engaged with each other.

Figure 14:
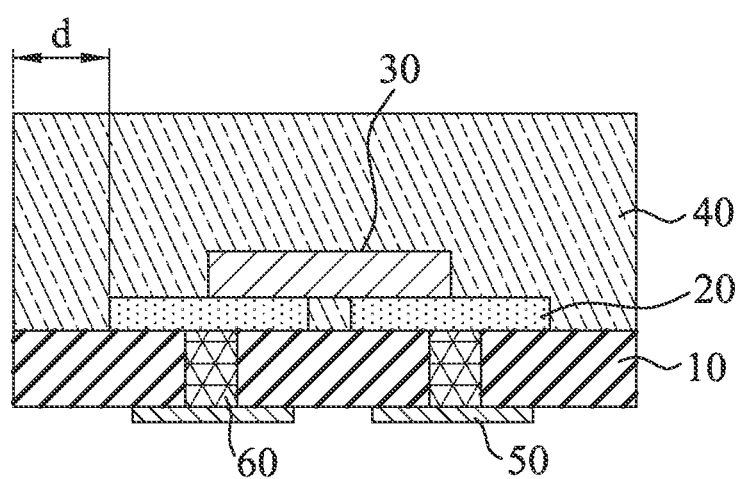
FIG. 14 is a top view illustrating still another configuration of the LED package.

In this embodiment, the thickness of the boundary region 202 is equal to that of the chip-mounting region 201, and is no less than a tenth of the thickness of the packaging material 40. The width (W, see FIG. 3) of the metal stage 20 is no less than a third of the thickness of the packaging material 40. Referring to FIG. 14, in one embodiment, a bottom portion of the packaging material 40 that surrounds the metal stage 20 has a width (d) that is no greater than 0.1 millimeters.

Figure 5:
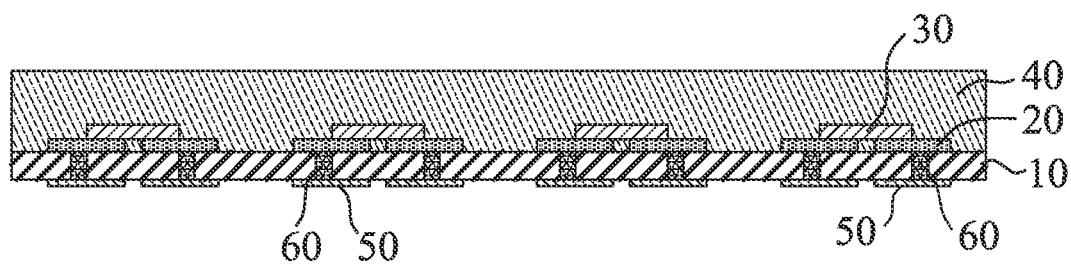
FIG. 5 is a sectional view illustrating a plurality of soldering plates and conductive structures formed on the substrate.

With reference to FIGS. 5 and 14, in one embodiment, the method for manufacturing an LED package further includes, after step 4), steps of:

5) forming a plurality of conductive structures 60 in the substrate 10, the conductive structures 60 being respectively and electrically connected to the positive and negative electrodes of the LED chip 30; and 6) forming a plurality of soldering plates 50 on the lower surface of the substrate 10, the soldering plates 50 being respectively and electrically connected to the conductive structures 60.

Each of the conductive structures 60 may include a through hole that is formed through the substrate 10.

In one embodiment, each of the soldering plates 50 is electrically connected to a respective one of the positive and negative electrodes of the LED chip 30 via a respective one of the conductive structures 60, a respective one of the boundary sections 203 of the boundary region 202 and a respective one of the first and second mounting sections 2011, 2012.

Forming the soldering plates 50 on the lower surface of the substrate 10 facilitates other adhering structures to be formed on the LED package. When the LED package is mounted onto a printed circuit board (PCB) through a reflow soldering technique, air bubbles may not be generated since the packaging material 40 and the lumpy structure of the metal stages 20 are engaged with each other. As such, yield rate of products to be subsequently made is enhanced.

Second Embodiment

The second embodiment is directed to a method for manufacturing an LED package, and is similar to the first embodiment. The differences between the first and second embodiments are described as follows.

Figure 7:
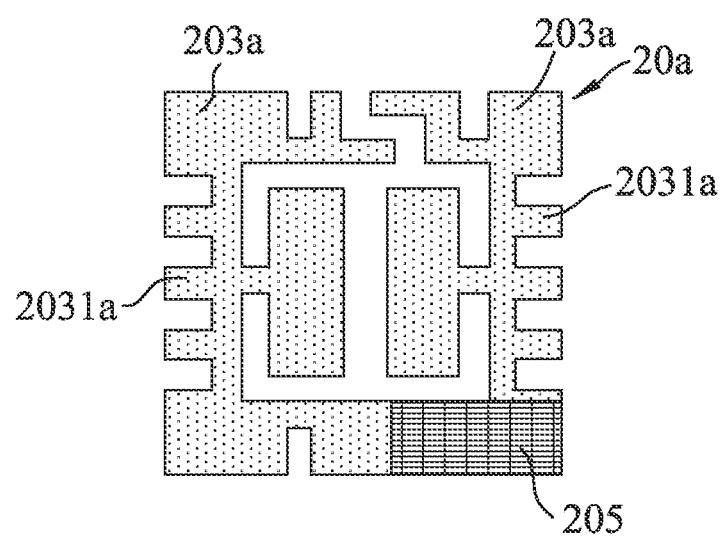
FIG. 7 is a top view illustrating another configuration of the metal stage.

Each of the boundary sections 203a of the metal stage 20a itself has a lumpy structure. With reference to FIG. 7, each of the boundary sections 203, has a comb structure 2031a that may be formed at an inner edge or an outer edge of the boundary section 203a. As such, the packaging material is filled in the gaps defined by the comb structure 2031a of each of the boundary sections 203a, so as to enhance the engagement between the packaging material and the metal stage 20a, and to enhance binding among the components of the LED package.

Figure 8:
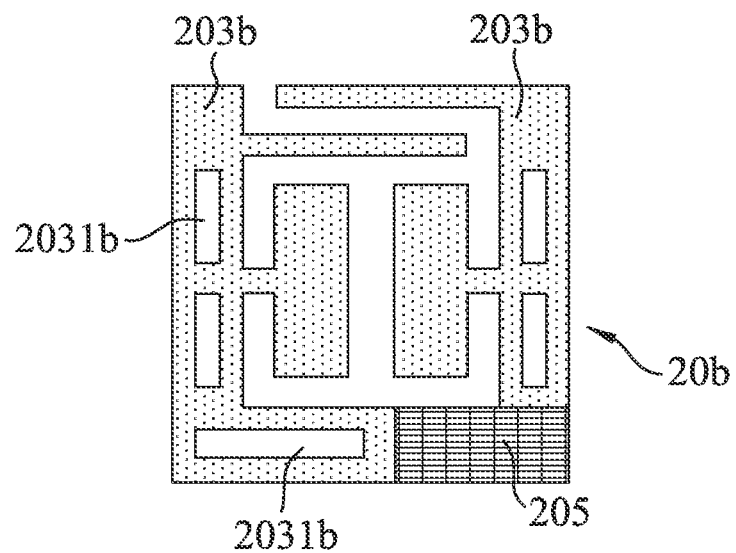
FIG. 8 is a top view illustrating still another configuration of the metal stage.

With reference to FIG. 8, each of the boundary sections 203b of the metal stage 20b may have at least one through hole 2031b formed therethrough. The through hole 2031b may be rectangular, rhombus-shaped, elliptic or circular.

Figure 9:
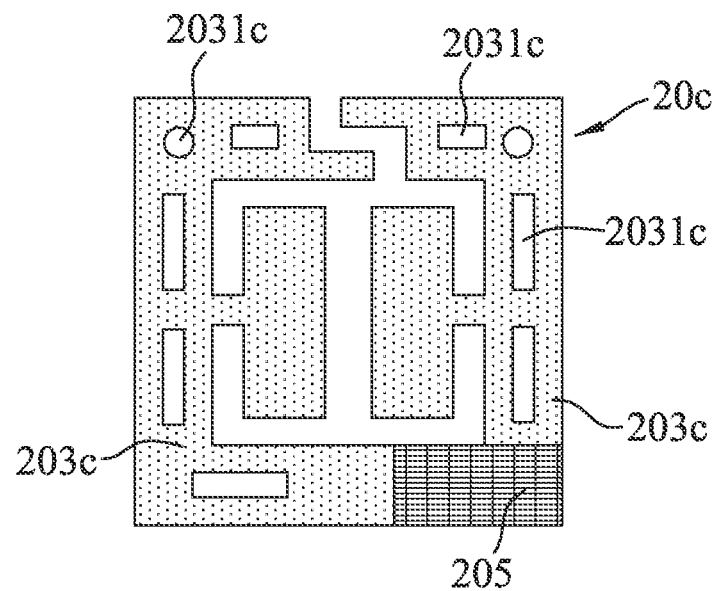
FIG. 9 is a top view illustrating still another configuration of the metal stage.

With reference to FIG. 9, each of the boundary sections 203c of the metal stage 20c may have at least one through hole 2031c formed therethrough, so that the boundary section 203c is configured not to have a relatively large top flat surface. The through hole 2031c may be rectangular or circular.

Since the packaging material is filled in the through hole 2031b, 2031c of each of the boundary sections 203b, 203c, engagement between the packaging material and the metal stage 20b, 20c is enhanced, thereby enhancing binding among the components of the LED package.

Third Embodiment

The third embodiment is directed to a method for manufacturing an LED package, and is similar to the second embodiment. The differences between the second and third embodiments are as follows.

Figure 10:
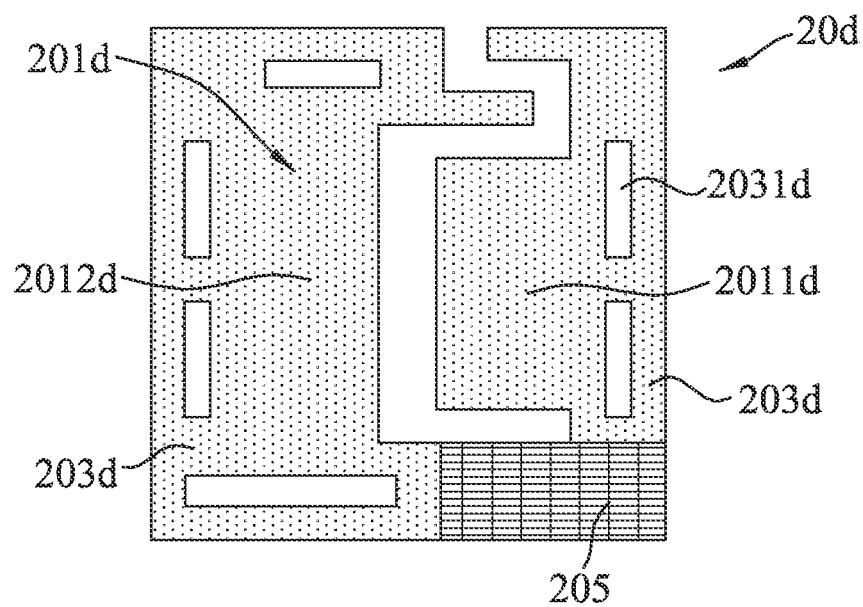
FIG. 10 is a top view illustrating still another configuration of the metal stage.

With reference to FIG. 10, the metal stage 20d is configured such that the chip-mounting region 201d is connected to boundary region 202d. In detail, each of the boundary sections 203d is connected to a respective one of the first mounting section 2011d and the second mounting section 2012d of the chip-mounting region 201d without forming a recessed region therebetween (i.e., no gap is formed between each of the boundary sections 203d and the respective one of the first mounting section 2011d and the second mounting section 2012d). Since the first mounting section 2011d and the second mounting section 2012d are connected to the positive and negative electrodes of the LED chip, the boundary sections 203d may respectively serve as the positive and negative electrodes of the LED chip.

In this embodiment, each of the boundary sections 203d may have at least one through hole 2031d formed therethrough. The through hole 2031d may be rectangular, rhombus-shaped, elliptic, circular, or of other shapes.

The packaging material is filled in the through hole 2031d of each of the boundary sections 203d, so as to enhance the engagement between the packaging material and the metal stage 20d, thereby enhancing binding among the components of the LED package.

Fourth Embodiment

The fourth embodiment is directed to a method for manufacturing an LED package, and is similar to the first embodiment. The differences between the first and fourth embodiments are as follows.

Figure 11:
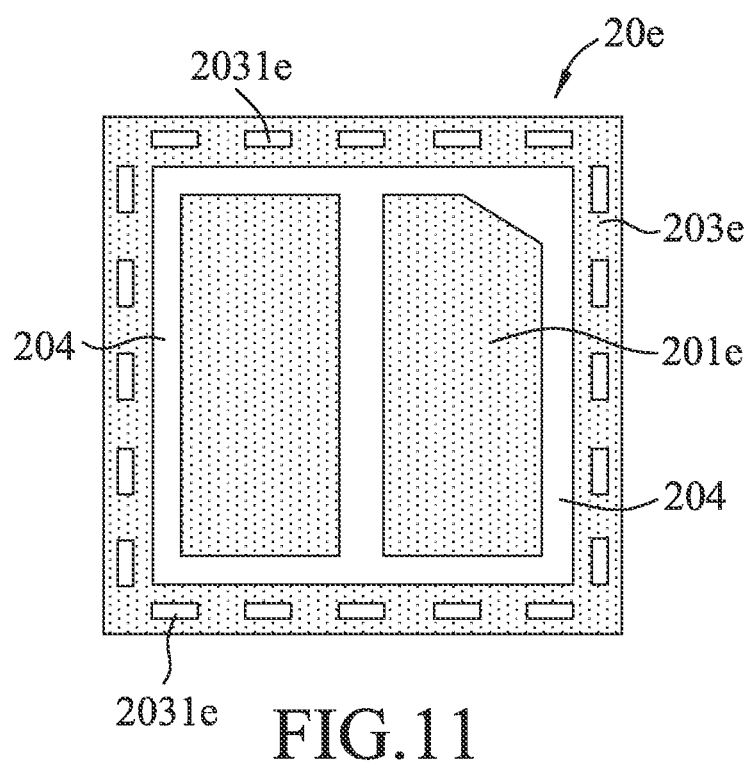
FIG. 11 is a top view illustrating still another configuration of the metal stage.

With reference to FIG. 11, the boundary region 202e has only one boundary section 203e that has an enclosed structure and that is spaced apart from the chip-mounting region 201e to form the recessed region 204 therebetween. The boundary section 203e is formed with at least one rectangular through hole 2031e. In one embodiment, the through hole 2031e may be rectangular, rhombus-shaped, elliptic, circular, or of other shapes. In one embodiment, the boundary section 203e may have a comb structure (see FIG. 7).

Since the boundary section 203e is spaced apart from the chip-mounting region 201e, electric connection between the boundary section 203e and the chip-mounting region 201e is not established, and the first mounting section 2011e and the second mounting section 2012e of the chip-mounting region 201e serve as the positive and negative electrodes of the LED chip.

In this embodiment, the conductive structures (not shown in FIG. 11, see the conductive structures 60 as shown in FIG. 5) are respectively and electrically connected to the first mounting section 2011e and the second mounting section 2012e of the chip-mounting region 201e, and the soldering plates (not shown in FIG. 11, see the soldering plates 50 as shown in FIG. 5) are respectively and electrically connected to the conductive structures, so as to be respectively and electrically connected to the positive and negative electrodes of the LED chip.

Fifth Embodiment

Figure 12:
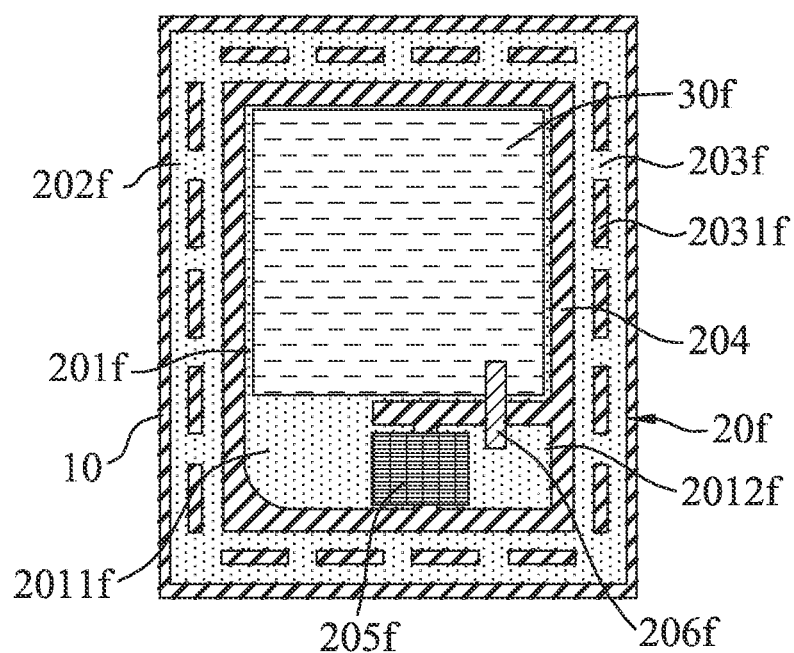
FIG. 12 is a top view illustrating another configuration of the LED package.

With reference to FIG. 12, the fifth embodiment is directed to a method for manufacturing an LED package, and includes steps of:

1) providing a substrate 10, the substrate 10 having an upper surface, and a lower surface that is opposite to the upper surface;

2) forming at least one metal stage 20f on the upper surface of the substrate 10, the metal stage 20f having a lumpy structure; and 3) mounting at least one LED chip 30f onto the at least one metal stage 20f.

The substrate 10 may be made of a material that is commonly used in this field, such as ceramic or silicon. Preferably, the substrate 10 is made of ceramic.

In this embodiment, the LED chip 30f is configured as a vertical LED chip (i.e., the opposite electrodes are disposed in a vertical direction). In this embodiment, the boundary region 202f and the chip-mounting region 201f of the metal stage 20f are spaced apart from each other to form the recessed region 204 therebetween. The boundary section 203f is formed with at least one rectangular through hole 2031f. In one embodiment, the through hole 2031f may be rectangular, rhombus-shaped, elliptic, circular, or of other shapes.

The chip-mounting region 201f includes a first mounting section 2011f and a second mounting section 2012f that are spaced apart from each other. The first mounting section 2011f has a main portion to which the vertical LED chip 30f is mounted, and an extension portion that extends from the main portion of the first mounting section 2011f. Preferably, the width of the extension portion is less than a half of the width of the main portion. The second mounting section 2012f is disposed adjacent to the extension portion of the first mounting section 2011f. One of the positive and negative electrodes of the LED chip 301 is connected to the first mounting section 2011f. The other one of the positive and negative electrodes of the LED chip 301 is connected to the second mounting section 2012f via a soldered wire 206f. The extension portion of the first mounting section 2011f and the second mounting section 2012f may serve as the positive and negative electrodes of the LED chip 30f. The metal stage 20f further has a protection component packaging area 205f that is formed between the extension portion of the first mounting section 2011f and the second mounting section 2012f.

With reference to FIG. 12, preferably, a distance between a distal edge of the extension portion of the first mounting section 2011f that is distal from the second mounting section 2012f and a distal edge of the second mounting section 2012f that is distal from the extension portion of the first mounting section 2011f is no greater than the width of the main portion of the first mounting section 2011f to which the LED chip 30f is mounted.

Figure 13:
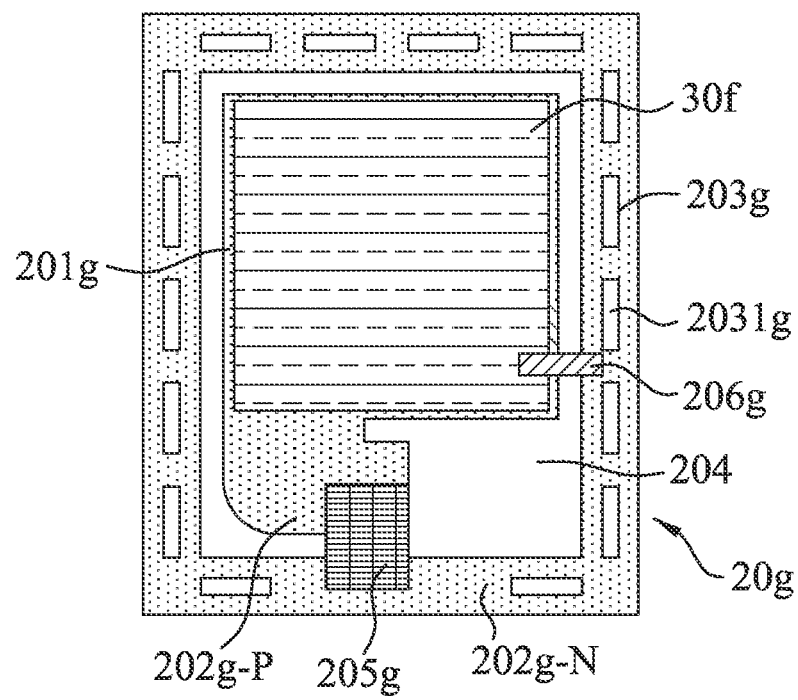
FIG. 13 is a top view illustrating still another configuration of the LED package.

With reference to FIG. 13, in another configuration of the LED package, chip-mounting region 201g only includes a mounting section to which the vertical LED chip 30f is mounted. One of the positive and negative electrodes of the LED chip 30f is connected to the mounting section of the chip-mounting region 201g. The other one of the positive and negative electrodes of the LED chip 30f is connected to the boundary section 203g via a soldered wire 206g. The chip-mounting region 201g and the boundary section 203g may serve as the positive and negative electrodes of the LED chip 30f. The metal stage 20g further has a protection component packaging area 205g that is formed between the chip-mounting region 201g and the boundary section 203g. The boundary section 203g is formed at least one rectangular through hole 2031g. In one embodiment, the through hole 2031g may be rectangular, rhombus-shaped, elliptic, circular, or of other shapes.

The fifth embodiment further includes, after step 3), a step of: 4) covering the LED chip 30f, the metal stage 20 and the substrate 10 with a packaging material. The packaging material is filled in the through hole 2031f, 2031g of the boundary sections 203f, 203g, so as to enhance the engagement between the packaging material and the metal stage 20f, 20g, thereby enhancing binding among the components of the LED package.

Sixth Embodiment

The sixth embodiment is directed to a method for manufacturing an LED package, and is similar to the first embodiment. The sixth embodiment further includes, after step 4), a step of: 7) cutting the thus obtained product of step 4) along a cutting line(s) that extends in a direction (F) perpendicular to the substrate 10 and that passes through a middle point of the first gap 101 (see FIG. 4, with reference to FIG. 2). As a result, the LED package shown in FIG. 14 that contains only one LED chip is obtained.

By virtue of the engagement between the packaging material 40 and the metal stage 20, the packaging material 40 may not be separated from the substrate 10 due to external force or vibration generated during the cutting process.

Seventh Embodiment

Referring again to FIGS. 1 to 5, the seventh embodiment is directed to an LED package, and includes a substrate 10, at least one metal stage 20, at least one LED chip 30 and a packaging material 40.

The substrate 10 has an upper surface, and a lower surface that is opposite to the upper surface. The substrate 10 may be made of a material that is in common usage in this field, such as ceramic or silicon. Preferably, the substrate 10 is made of ceramic.

The metal stage 20 is metal layer that is formed on the upper surface of the substrate 10 through an ion-beam sputtering technique combined with electroplating or chemical plating techniques, and has a lumpy structure. The metal stage 20 may be made from a metal such as copper.

With reference to FIGS. 2 and 3, the LED package may include a plurality of metal stages 20 formed on the upper surface of the substrate 10, and a plurality of LED chips 30 respectively mounted to the metal stages 20. Any two adjacent ones of the metal stages 20 are spaced apart from each other by a first gap 101.

With reference to FIG. 3, in this embodiment, the LED chip(s) 30 is (are) mounted on the metal stage(s) 20 through a flip-chip technique.

With reference to FIG. 6, the metal stage 20 includes a chip-mounting region 201 at a central portion thereof for mounting the LED chip 30 thereon. The chip-mounting region 201 includes a first mounting section 2011 and a second mounting section 2012. The LED chip 30 is mounted on the metal stage 20 through the flip-chip technique, and has positive and negative electrodes. The first mounting section 2011 of the chip-mounting region 201 is connected to one of the positive and negative electrodes of the LED chip 30, and the second mounting section 2012 of the chip-mounting region 201 is connected to the other one of the positive and negative electrodes of the LED chip 30. The first mounting section 2011 and the second mounting section 2012 of the chip-mounting region 201 are spaced apart from each other by a second gap 102. The widths (L1, L2) of the first gap 101 and the second gap 102 may be determined according to the dimensions of the LED chip 30 and the LED package.

The metal stage 20 further includes a boundary region 202 at a periphery thereof, and a recessed region 204 that is formed between the chip-mounting region 201 and the boundary region 202. In one embodiment, the thickness of the boundary region 202 is equal to that of the chip-mounting region 201. In one embodiment, the width of the recessed region 204 is smaller than at least one of the width of the chip-mounting region 201 and the width of the boundary region 202. Preferably, a ratio of the height of the recessed region 204 to the width of the recessed region 204 is no less than 0.5, and the height of the recessed region 204 is equal to the thickness of the boundary region 202. The boundary region 202 includes two spaced-apart boundary sections 203. Each of the boundary sections 203 has a connecting portion 209 connected to a respective one of the first mounting section 2011 and the second mounting section 2012 of the chip-mounting region 201. Since the first mounting section 2011 and the second mounting section 2012 are connected to the positive and negative electrodes of the LED chip 30, the boundary sections 203 of the boundary region 202 may respectively serve as the positive and negative electrodes of the LED chip 30. In one embodiment, each of the boundary sections 203 of the boundary region 202 may have an L-shaped structure. The chip-mounting region 201 and the boundary region 202 cooperatively form the lumpy structure of the metal stage 20.

In this embodiment, the metal stage 20 may be made by forming a thin metal layer on the substrate 10 through an ion-beam sputtering technique, and then increasing the thickness of the thin metal layer through electroplating or chemical plating techniques.

With reference to FIG. 6, in one embodiment, the metal stage 20 further includes a protection component packaging area 205 formed at a portion of the boundary region 202 for mounting a protection device (e.g., a zener diode) thereon. In one embodiment, the protection component packaging area 205 is formed at a corner of the boundary region 202.

With reference to FIG. 4, the packaging material 10 covers the LED chips 30, the metal stages 20 and the substrate 10, and preferably is fluororesin. After the packaging material 40 covers the LED chips 30, the metal stages 20 and the substrate 10, the LED package is heated up, by baking or hot-pressing, such that the packaging material 40 is filled in the first gaps 101 between the metal stages 20, the second gap 102 in the chip-mounting regions 201 of the metal stages 20, the recessed region 204 of the metal stages 20 and the gaps between the boundary sections 203 of each of the metal stages 20. The packaging material 40 is adhered to the LED chips 30, the metal stages 20 and the substrate 10 after the LED package is heated up, followed by cooling the LED package. Since the packaging material 40 is adhered to the LED chips 30, the metal stages 20 and the substrate 10, and since the packaging material 40 is filled in the first gaps 101 between the metal stages 20, the second gap 102 in the chip-mounting regions 201 of the metal stages 20, the recessed region 204 of the metal stages 20 and the gaps between the boundary sections 203 of each of the metal stages 20, the packaging material 40 and the lumpy structure of the metal stages 20 are engaged with each other, such that binding among the components of the LED package is enhanced, thereby preventing separation of the packaging material 40 from the substrate due to vibration generated during transportation of the LED package.

In addition, ceramic has a coefficient of expansion of $1.8*10^{-5}/° C.$, while fluororesin has a coefficient of expansion of $8~12*10^{-5}/° C.$ Although fluororesin deforms relatively seriously during the heating-up and cooling-down processes, the packaging material 40 may not be separated from the substrate 10 since the packaging material 40 and the lumpy structure of the metal stages 20 are engaged with each other.

In this embodiment, the thickness of the boundary region 202 is equal to that of the chip-mounting region 201, and is no less than a tenth of the thickness of the packaging material 40. The width (W, see FIG. 3) of the metal stage 20 is no less than a third of the thickness of the packaging material 40. Referring to FIG. 14, in one embodiment, a bottom portion of the packaging material 40 that surrounds the metal stage 20 has a width (d) that is no greater than 0.1 millimeters.

With reference to FIGS. 5 and 14, in one embodiment, the LED package further includes a plurality of conductive structures 60 formed in the substrate 10, and a plurality of soldering plates 50 formed on the lower surface of the substrate 10.

The conductive structures 60 are respectively and electrically connected to the positive and negative electrodes of the LED chip 30. Each of the conductive structures 60 may includes a through hole that is formed through the substrate 10.

The soldering plates 50 are respectively and electrically connected to the conductive structures 60. In one embodiment, each of the soldering plates 50 is electrically connected to a respective one of the positive and negative electrodes of the LED chip 30 via a respective one of the conductive structures 60, a respective one of the boundary sections 203 of the boundary region 202 and a respective one of the first and second mounting sections 2011, 2012.

The presence of the soldering, plates 50 on the lower surface of the substrate 10 facilitates other adhering structures to be formed on the LED package. When the LED package is mounted onto a printed circuit board (PCB) through a reflow soldering technique, air bubbles may not be generated since the packaging material 40 and the lumpy structure of the metal stages 20 are engaged with each other. As such, yield rate of products to be subsequently made is enhanced.

Eighth Embodiment

The eighth embodiment is directed to an LED package, and is generally similar to the seventh embodiment. The differences between the seventh and eighth embodiments are as follows.

Each of the boundary sections 203a of the metal stage 20a itself has a lumpy structure. With reference to FIG. 7, each of the boundary sections 203a has a comb structure 2031a that may be formed at an inner edge or an outer edge of the boundary section 203a. As such, the packaging material is filled in the gaps defined by the comb structure 2031a of each of the boundary sections 203a, so as to enhance the engagement between the packaging material and the metal stage 20a, and to enhance binding among the components of the LED package.

With reference to FIG. 8, each of the boundary sections 203b of the metal stage 20b may have at least one through hole 2031b formed therethrough. The through hole 2031b may be rectangular, rhombus-shaped, elliptic or circular.

With reference to FIG. 9, each of the boundary sections 203c of the metal stage 20c may have at least one through hole 2031c formed therethrough, so that the boundary section 203c is configured not to have a relatively large top flat surface. The through hole 2031c may be rectangular or circular.

Since, the packaging material is filled in the through hole 2031b, 2031c of each of the boundary sections 203b, 203c, engagement between the packaging material and the metal stage 20b, 20c is enhanced, thereby enhancing binding among the components of the LED package.

Ninth Embodiment

The ninth embodiment is directed to an LED package, and is generally similar to the eighth embodiment. The differences between the eighth and ninth embodiments are as follows.

With reference to FIG. 10, the metal stage 20d is configured such that the chip-mounting region 201d is connected to boundary region 202d. In detail, each of the boundary sections 203d is connected to a respective one of the first mounting section 2011d and the second mounting section 2012d of the chip-mounting region 201d without forming a recessed region therebetween (i.e., no gap is formed between each of the boundary sections 203d and the respective one of the first mounting section 2011d and the second mounting section 2012d). Since the first mounting section 2011d and the second mounting section 2012d are connected to the positive and negative electrodes of the LED chip, the boundary sections 203d may respectively serve as the positive and negative electrodes of the LED chip.

In this embodiment, each of the boundary sections 203d may have at least one through hole 2031d formed therethrough. The through hole 2031d may be rectangular, rhombus-shaped, elliptic, circular, or of other shapes.

The packaging material is filled in the through hole 2031d of each of the boundary sections 203d, so as to enhance the engagement between the packaging material and the metal stage 20d, thereby enhancing binding among the components of the LED package.

Tenth Embodiment

The tenth embodiment is directed to an LED package, and is generally similar to the seventh embodiment. The differences between the seventh and tenth embodiments are as follows.

With reference to FIG. 11, the boundary region 202e has only one boundary section 203e that has an enclosed structure and that is spaced apart from the chip-mounting region 201e to form the recessed region 204 therebetween. The boundary section 203e is formed with at least one rectangular through hole 2031e. In one embodiment, the through hole 2031e may be rectangular, rhombus-shaped, elliptic, circular, or of other shapes. In one embodiment, the boundary section 203e may have a comb structure (referring to FIG. 7).

Since the boundary section 203e is spaced apart from the chip-mounting region 201e, electric connection between the boundary section 203e and the chip-mounting region 201e is not established, and the first mounting section 2011e and the second mounting section 2012e of the chip-mounting region 201e serve as the positive and negative electrodes of the LED chip.

In this embodiment, the conductive structures (not shown in FIG. 11, see the conductive structures 60 as shown in FIG. 5) are respectively and electrically connected to the first mounting section 2011e and the second mounting section 2012e of the chip-mounting region 201e, and the soldering plates (not shown in FIG. 11, see the soldering plates 50 as shown in FIG. 5) are respectively and electrically connected to the conductive structures, so as to be respectively and electrically connected to the positive and negative electrodes of the LED chip.

Eleventh Embodiment

With reference to FIG. 12, the eleventh embodiment is directed to an LED package, and includes a substrate 10, at least one metal stage 20f and at least one LED chip 30f.

The substrate 10 has an upper surface, and a lower surface that is opposite to the upper surface. The substrate 10 may be made of a material that is commonly used in this field, such as ceramic or silicon. Preferably, the substrate 10 is made of ceramic.

The metal stage 20f is formed on the upper surface of the substrate 10, and has a lumpy structure.

The LED chip 30f is mounted onto the metal stage 20f.

In this embodiment, the LED chip 30f is configured as a vertical LED chip (i.e., the opposite electrodes are disposed a vertical direction). In this embodiment, the boundary region 202f and the chip-mounting region 201f of the metal stage 20f are spaced apart from each other to form the recessed region 204 therebetween. The boundary section 203f is formed with at least one rectangular through hole 2031f. In one embodiment, the through hole 2031f may be rectangular, rhombus-shaped, elliptic, circular, or of other shapes.

The chip-mounting region 201f includes a first mounting section 2011f and a second mounting section 2012f that are spaced apart from each other. The first mounting section 2011f has a main portion to which the vertical LED chip 30f is mounted, and an extension portion that extends from the main portion of the first mounting section 2011f. Preferably, the width of the extension portion is less than a half of the width of the main portion. The second mounting section 2012f is disposed adjacent to the extension portion of the first mounting section 2011f. One of the positive and negative electrodes of the LED chip 30f is connected to the first mounting section 2011f. The other one of the positive and negative electrodes of the LED chip 30f is connected to the second mounting section 2012f via a soldered wire 206f. The extension portion of the first mounting section 2011f and the second mounting section 2012f may serve as the positive and negative electrodes of the LED chip 30f. The metal stage 20f further has a protection component packaging area 205f that is formed between the extension portion of the first mounting section 2011f and the second mounting section 2012f.

With reference to FIG. 12, preferably, a distance between a distal edge of the extension portion of the first mounting section 2011f that is distal from the second mounting section 2012f and a distal edge of the second mounting section 2012f that is distal form the extension portion of the first mounting section 2011f is no greater than the width of the main portion of the first mounting section 2011f to which the LED chip 30f is mounted.

With reference FIG. 13, in another configuration of the LED package, chip-mounting region 201g only includes a mounting section to which the vertical LED chip 30f is mounted. One of the positive and negative electrodes of the LED chip 30f is connected to the mounting section of the chip-mounting region 201g. The other one of the positive and negative electrodes of the LED chip 30f is connected to the boundary section 203g via a soldered wire 206g. The chip-mounting region 201g and the boundary section 203g may serve as the positive and negative electrodes of the LED chip 30f. The metal stage 20g further has a protection component packaging area 205g that is formed between the chip-mounting region 201g and the boundary section 203g. The boundary section 203g is formed with at least one rectangular through hole 2031g. In one embodiment, the through hole 2031g may be rectangular, rhombus-shaped, elliptic, circular, or of other shapes.

The eleventh embodiment further includes a packaging material (not shown) covering the LED chip 30f, the metal stage 20 and the substrate 10. The packaging material is filled in the through hole 2031f, 2031g of the boundary sections 203f, 203g, so as to enhance the engagement between the packaging material and the metal stage 20f, 20g, thereby enhancing binding among the components of the LED package.

Twelfth Embodiment

Referring to FIG. 14, the twelfth embodiment is directed to an LED package that contains only one LED chip. The twelfth embodiment is formed by cutting the product shown in FIG. 4 along a cutting lane(s) that extends in a direction (F, see FIG. 4) perpendicular to the substrate 10 and that pass through a middle point of the first gap 101 (with reference to FIG. 2).

By virtue of the engagement between the packaging material 40 and the metal stage 20, the packaging material 40 may not be separated from the substrate 10 due to external force or vibration generated during the cutting process.

The LED package and the method for manufacturing the LED package according to the disclosure has the following advantages:

The packaging material and the lumpy structure of the metal stages are engaged with each other, such that a binding force among the components of the LED package is enhanced and that the packaging material is prevented from being separated from the substrate due to vibration generated during transportation of the LED package.

When the LED package is mounted onto a printed circuit board (PCB) through a reflow soldering technique, air bubbles may not be generated since the packaging material and the lumpy structure of the metal stages are engaged with each other. As such, yield rate of products to be subsequently made is enhanced.

By virtue of the engagement between the packaging material 40 and the metal stage 20, the packaging material 40 may not be separated from the substrate 10 due to external force or vibration during the cutting process.

Although fluororesin deforms relatively seriously during the heating-up and cooling-down processes, the packaging material 40 may not be separated from the substrate 10 since the packaging material 40 and the lumpy structure of the metal stages 20 are engaged with each other.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that is the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode (LED) package comprising:
    a substrate having an upper surface, and a lower surface opposite to said upper surface;
    a metal stage formed on said upper surface of said substrate;
    at least one LED chip mounted on said metal stage; and
    a packaging material covering said LED chip, said metal stage and said substrate, said packaging material and said metal stage being engaged with each other;
    wherein said metal stage includes a chip-mounting region for mounting said LED chip thereon, and a boundary region;
    wherein said boundary region is located at a periphery of said metal stage;
    wherein said boundary region includes a boundary section that is spaced apart from said chip-mounting region;
    wherein electric connection between said boundary section and said chip-mounting region is not established so that said boundary section is electrically insulated from said LED chip; and
    wherein said boundary section has an enclosed structure continuously surrounding said chip-mounting region, said boundary section having one of a through hole and a comb structure.

2. The LED package as claimed in claim 1, wherein said metal stage includes at least one plated metal layer formed on said substrate.

3. The LED package as claimed in claim 1, wherein said metal stage has a thickness that is no less than a tenth of the thickness of said packaging material.

4. The LED package as claimed in claim 1, wherein a bottom portion of said packaging material surrounding said metal stage has a width that is no greater than 0.1 millimeters.

5. The LED package as claimed in claim 1, wherein a width of said metal stage is no less than a third of the thickness of said packaging material.

6. The LED package as claimed in claim 1, wherein said chip-mounting region is located at a central portion of said metal plate, and includes a first mounting section and a second mounting section that are spaced apart from each other, said LED chip having positive and negative electrodes, said first mounting section of said chip-mounting region being connected to one of said positive and negative electrodes of said LED chip, said second mounting section of said chip-mounting region being connected to the other one of said positive and negative electrodes of said LED chip.

7. The LED package as claimed in claim 1, wherein a thickness of said boundary region is equal to that of said chip-mounting region.

8. The LED package as claimed in claim 1, wherein said metal stage further includes a protection component packaging area formed at a portion of said boundary region.

9. The LED package as claimed in claim 1, wherein said metal stage further includes a recessed region that is formed between said chip-mounting region and said boundary region.

10. The LED package as claimed in claim 9, wherein a ratio of a height of said recessed region to a width of said recessed region is no less than 0.5.

11. The LED package as claimed in claim 9, wherein a width of said recessed region is smaller than at least one of a width of said chip-mounting region and a width of said boundary region.

12. The LED package as claimed in claim 1, further comprising a plurality of conductive structures that are formed in said substrate and that are respectively and electrically connected to positive and negative electrodes of said LED chip, and a plurality of soldering plates that formed on the lower surface of said substrate and that are respectively and electrically connected to said conductive structures.

13. The LED package as claimed in claim 9, wherein said chip-mounting region and said boundary region are completely separated from each other by said recessed region, a depth of said recessed region is equal to a thickness of said chip-mounting region and a thickness of said boundary region.

14. The LED package as claimed in claim 1, wherein said substrate is made of one of ceramic and silicon.

15. The LED package as claimed in claim 1, wherein a coefficient of expansion of said packaging material is different from that of said substrate.

16. The LED package as claimed in claim 1, wherein said packaging material is fluororesin.

17. The LED package as claimed in claim 1, wherein said LED chip is configured as a deep ultraviolet LED chip.

\* \* \* \* \*